US009685459B2

(12) United States Patent
Li et al.

(10) Patent No.: US 9,685,459 B2
(45) Date of Patent: Jun. 20, 2017

(54) FLEXIBLE SUBSTRATE, FLEXIBLE DISPLAY PANEL AND FLEXIBLE DISPLAY DEVICE

(71) Applicant: BOE TECHNOLOGY GROUP CO., LTD., Beijing (CN)

(72) Inventors: Yunfei Li, Beijing (CN); Ling Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 13 days.

(21) Appl. No.: 14/771,329

(22) PCT Filed: Sep. 25, 2014

(86) PCT No.: PCT/CN2014/087394
§ 371 (c)(1),
(2) Date: Aug. 28, 2015

(87) PCT Pub. No.: WO2016/000329
PCT Pub. Date: Jan. 7, 2016

(65) Prior Publication Data
US 2016/0365364 A1    Dec. 15, 2016

(30) Foreign Application Priority Data
Jun. 30, 2014    (CN) .......................... 2014 1 0307410

(51) Int. Cl.
| | |
|---|---|
| *H01L 27/12* | (2006.01) |
| *H01L 29/417* | (2006.01) |
| *H01L 29/423* | (2006.01) |
| *H01L 29/78* | (2006.01) |
| *H01L 29/06* | (2006.01) |

(Continued)

(52) U.S. Cl.
CPC ........ *H01L 27/1218* (2013.01); *H01L 27/124* (2013.01); *H01L 27/1255* (2013.01);
(Continued)

(58) Field of Classification Search
CPC ..................... H01L 27/1218; H01L 27/1255
(Continued)

(56) References Cited

U.S. PATENT DOCUMENTS

| | | | | |
|---|---|---|---|---|
| 5,831,284 A | * | 11/1998 | Park .................. | G02F 1/136213 257/296 |
| 2006/0172488 A1 | * | 8/2006 | Fujishima ....... | H01L 21/823462 438/250 |

(Continued)

FOREIGN PATENT DOCUMENTS

| | | |
|---|---|---|
| CN | 1465077 A | 12/2003 |
| CN | 102486906 A | 6/2012 |

(Continued)

OTHER PUBLICATIONS

Office Action dated May 25, 2016 issued in corresponding Chinese Application No. 201410307410.0.

(Continued)

*Primary Examiner* — Long K Tran
(74) *Attorney, Agent, or Firm* — Nath, Goldberg & Meyer; Joshua B. Goldberg; Christopher Thomas

(57) ABSTRACT

The present invention provides a flexible substrate, a flexible display panel and a flexible display device. The flexible substrate includes an on-off element and an insulating layer, wherein a part of the insulating layer serves as a part of the on-off element, and the part of the insulating layer serving as a part of the on-off element is separated from rest part of the insulating layer. In the flexible substrate, the part of the insulating layer serving as a part of the on-off element is separated from the rest part of the insulating layer, such that cracks generated in the reset part of the insulating layer are unlikely to extend to the region where the on-off element is located, thus the poor contact or abnormal on-off phenomenon of the on-off element can be avoided.

16 Claims, 3 Drawing Sheets

(51) Int. Cl.
*G02F 1/1368* (2006.01)
*G02F 1/1362* (2006.01)

(52) U.S. Cl.
CPC ............ *H01L 29/06* (2013.01); *H01L 29/417* (2013.01); *H01L 29/423* (2013.01); *H01L 29/78* (2013.01); *G02F 1/1368* (2013.01); *G02F 1/136213* (2013.01)

(58) Field of Classification Search
USPC .......................................................... 257/71
See application file for complete search history.

(56) References Cited

U.S. PATENT DOCUMENTS

| | | | |
|---|---|---|---|
| 2007/0158648 A1 | 7/2007 | Suh et al. | |
| 2011/0049598 A1* | 3/2011 | Hirano | ............. H01L 29/41733 257/300 |
| 2012/0175619 A1* | 7/2012 | Yamazaki | ........... H01L 27/3244 257/59 |
| 2013/0075761 A1* | 3/2013 | Akiyama | .............. H01L 27/288 257/80 |

FOREIGN PATENT DOCUMENTS

| | | |
|---|---|---|
| CN | 103441119 A | 12/2013 |
| CN | 103545320 A | 1/2014 |
| CN | 203521412 U | 4/2014 |
| CN | 204029804 U | 12/2014 |

OTHER PUBLICATIONS

International Search Report issued in International Application No. PCT/CN2014/087394 along with the English translation of the Written Opinion of the International Searching Authority.

* cited by examiner

-- PRIOR ART --

FLEXIBLE SUBSTRATE, FLEXIBLE DISPLAY PANEL AND FLEXIBLE DISPLAY DEVICE

FIELD OF THE INVENTION

The present invention relates to the field of display technology, and particularly relates to a flexible substrate, a flexible display panel and a flexible display device.

BACKGROUND OF THE INVENTION

Flexible display devices are increasingly preferred by people since they are light, thin, bendable and even rollable and have good mechanical properties. At present, the flexible display devices are applied in our daily lives more and more extensively.

The flexible display devices are usually fabricated on flexible carriers. Because the flexible display devices have the property of being likely to bend, great challenges are brought to the design and fabrication thereof.

For example, as shown in FIG. 1, a storage capacitor 14 is usually an essential device in a flexible liquid crystal display device (LCD) and organic light emitting diode (OLED) display device. In general, the storage capacitor 14 is composed of upper and lower metal electrode plates 15 and an insulating layer 16 disposed there between. Since the flexible display device is easy to bend, the insulating layer 16 will break with more and more bending operations. If cracks extend to the metal electrode plates 15, the performance of the storage capacitor 14 will be degraded, and if a number of cracks are generated in the insulating layer 16, the capacitance value of the storage capacitor 14 will be seriously reduced, and even the storage capacitor 14 will be short circuited, which will directly affect the normal work of the flexible display device.

As another example, for the flexible display device, the insulating layer 16 will break with more and more bending operations. If the cracks penetrate through a via hole 2 formed in the insulating layer 16 resulting in damages to the conductive property of the via hole, poor contact and even open circuit will occur between different layers of metal electrodes connected through the via hole 2, which will directly affect the normal work of the flexible display device.

SUMMARY OF THE INVENTION

In view of the above technical problems in the prior art, the present invention provides a flexible substrate, a flexible display panel and a flexible display device. The flexible substrate can prevent cracks generated in an insulating layer from easily extending to a region where an on-off element is located so as to avoid the poor contact or abnormal on-off phenomenon of the on-off element, which not only guarantees the reliability of the on-off element, but also prolongs the service life of the on-off element and ensures normal work of the flexible substrate.

The present invention provides a flexible substrate, including an on-off element and an insulating layer, wherein a part of the insulating layer serves as a part of the on-off element, and the part of the insulating layer serving as a part of the on-off element and the rest part of the insulating layer excluding the part of the insulating layer are separated from each other.

Preferably, the part of the insulating layer and the rest part of the insulating layer are separated from each other through a spacer region.

Preferably, the on-off element includes a capacitor, and the part of the insulating layer serves as an insulating dielectric of the capacitor.

Preferably, the on-off element includes a conductive via hole, and the part of the insulating layer serves as a wall of the conductive via hole.

Preferably, the on-off element includes a transistor, and the part of the insulating layer serves as a switch insulating layer of the transistor.

Preferably, the flexible substrate further includes a drive transistor comprising a gate, a gate insulating layer, an active layer, a first source and a drain, the active layer being arranged above the gate, the gate insulating layer being arranged between the gate and the active layer, and the first source and the drain being arranged above the active layer and being respectively located at both ends of the active layer, wherein the on-off element includes a capacitor, one electrode plate of the capacitor is made from the same material and is formed in the same layers as the gate, while another electrode plate of the capacitor is made from the same material and is formed in the same layer as the first source, and a part of the gate insulating layer located between the two electrode plates of the capacitor serves as the part of the insulating layer.

Preferably, the flexible substrate further includes a drive transistor, a passivation layer and an anode, wherein the passivation layer and the anode are sequentially arranged above the drive transistor, the drive transistor includes a gate, a gate insulating layer, an active layer, a first source and a drain, the active layer being arranged above the gate, the gate insulating layer being arranged between the gate and the active layer, and the first source and the drain being arranged above the active layer and located at both ends of the active layer respectively, a first via hole is formed in a part of the passivation layer corresponding to a region overlapped with the anode and the first source, and a conductive material is filled in the first via hole to form the conductive via hole, which is used for electrically connecting the anode with the first source, wherein the on-off element includes the conductive via hole, the insulating layer includes the passivation layer, and the part of the passivation layer located between the anode and the first source serves as the part of the insulating layer.

Preferably, the flexible substrate further includes a drive transistor and a switch transistor, wherein the drive transistor includes a gate, a gate insulating layer, an active layer, a first source and a drain, the active layer being arranged above the gate, the gate insulating layer being arranged between the gate and the active layer, and the first source and the drain being arranged above the active layer and located at both ends of the active layer respectively; the switch transistor comprises a second source arranged on the same layer as the first source, a second via hole is formed in a part of the gate insulating layer corresponding to a region overlapped with the second source and the gate, and a conductive material is filled in the second via hole to electrically connect the second source with the gate, wherein the on-off element includes the switch transistor, the insulating layer includes the gate insulating layer, and the part of the gate insulating layer located between the second source and the gate serves as the part of the insulating layer.

Preferably, the transistor includes the drive transistor and the switch transistor which are arranged on the same layer and have the same structure;

the insulating layer includes the gate insulating layer, a part of the gate insulating layer located between the gate of the drive transistor and the active layer serves as the switch insulating layer of the drive transistor; and another part of the gate insulating layer located between the gate of the switch transistor and the active layer serves as the switch insulating layer of the switch transistor.

Preferably, the part of the insulating layer is of a single-layer structure made from an organic insulating material or an inorganic insulating material.

Preferably, the part of the insulating layer is of a double-layer structure of which one layer is made from an organic insulating material and the other layer is made from an inorganic insulating material.

Preferably, the flexible substrate further includes a flexible carrier on which both of the on-off element and the insulating layer are arranged.

The present invention further provides a flexible display panel, including the above-mentioned flexible substrate.

The present invention further provides a flexible display device, including the above-mentioned flexible display panel.

Beneficial effects of the present invention are as follows: in the flexible substrate provided by the present invention, the part of the insulating layer serving as a part of the on-off element is separated from the rest part of the insulating layer, such that cracks generated in the insulating layer are unlikely to extend to the region where the on-off element is located, namely the cracks are unlikely to extend from the rest part of the insulating layer to the part of the insulating layer serving as a part of the on-off element, and thus the poor contact or abnormal on-off phenomenon of the on-off element can be avoided, which not only guarantees the reliability of the on-off element, but also prolongs the service life of the on-off element and ensures the normal work of the flexible substrate.

The flexible display panel and the flexible display device provided by the present invention adopt the above-mentioned flexible substrate in order to not only improve the operation reliability of the flexible display panel and the flexible display device, but also prolong the service lives of the flexible display panel and the flexible display device.

Figure 1:
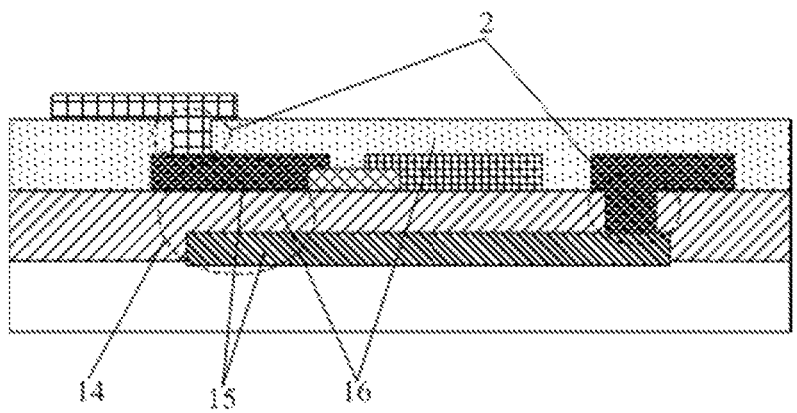
FIG. 1 is a section view of a partial structure of a flexible display device in the prior art.

REFERENCE NUMERALS 1. capacitor; 2. via hole; 21. first via hole; 22. second via hole; 3. gate; 4. gate insulating layer; 5. active layer; 6. first source; 7. drain; 8. passivation layer; 9. anode; 10. second source; 11. spacer region; 12. organic insulating layer; 13. flexible carrier; 14. storage capacitor; 15. metal electrode plate; 16. insulating layer.

DETAILED DESCRIPTION OF THE EMBODIMENTS

To make those skilled in the art better understand the technical solutions of the present invention, a flexible substrate, a flexible display panel and a flexible display device provided by the present invention will be further described in detail below in combination with the accompanying drawings and embodiments.

Embodiment 1

The embodiment provides a flexible substrate, including an on-off element and an insulating layer, wherein a part of the insulating layer can serve as a part of the on-off element, and the part of the insulating layer serving as a part of the on-off element is separated from the rest part of the insulating layer.

Wherein, the on-off element refers to that: under the condition that the element serves as a conducting element, current can flow through the element, and current can flow through circuit components connected to both ends of the on-off element; under the condition that the element serves as an electrical isolation element, the current cannot flow through the element, and the circuit components connected to the both ends of the on-off element can be electrical isolated from each other, namely the circuit components connected to the both ends of the on-off element are kept electrically disconnected; for example, a capacitor and a transistor on an array substrate are on-off elements. In addition, the on-off element further refers to that: when current flows through the element, the element can conduct the current to enable current conduction of elements connected to the both ends of the on-off element; when no current flows through the element, no current flows through the elements connected to the both ends of the on-off element, namely the elements connected to the both ends of the on-off element are kept electrically disconnected; for example, a via hole on the array substrate is an on-off element.

Figure 2:
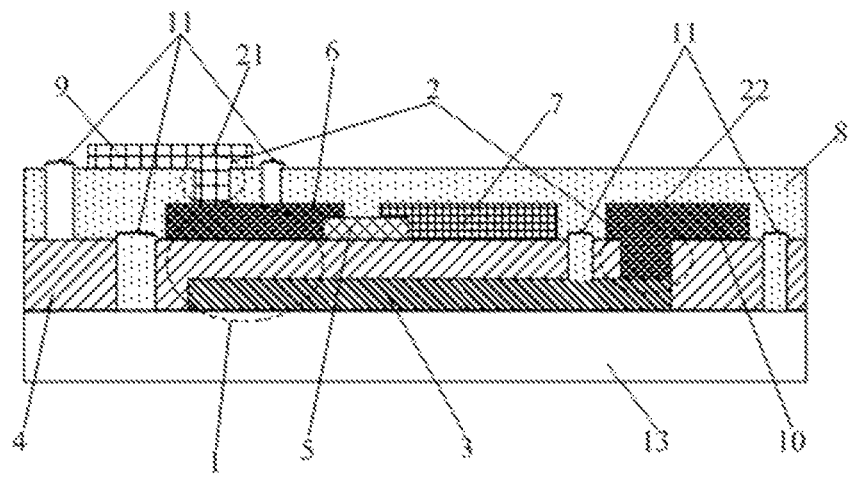
FIG. 2 is a section view of a structure of a flexible substrate in embodiment 1 of the present invention.
Figure 3:
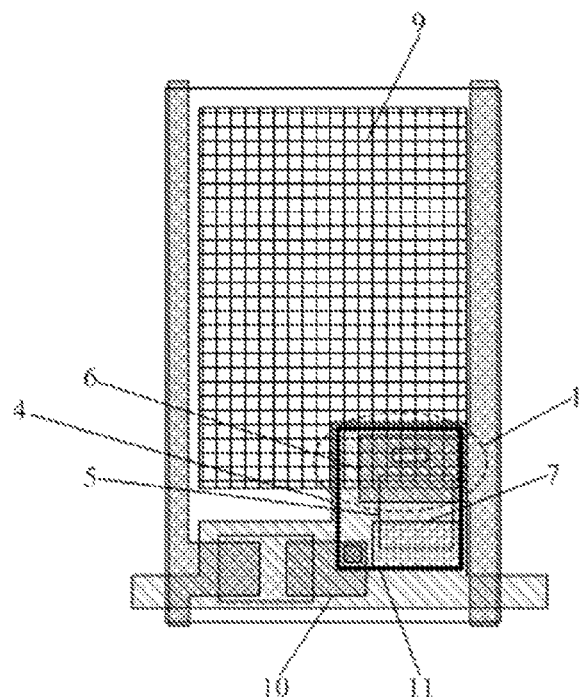
FIG. 3 is a top view of a structure of a capacitor in FIG. 2 in the flexible substrate.
Figure 4:
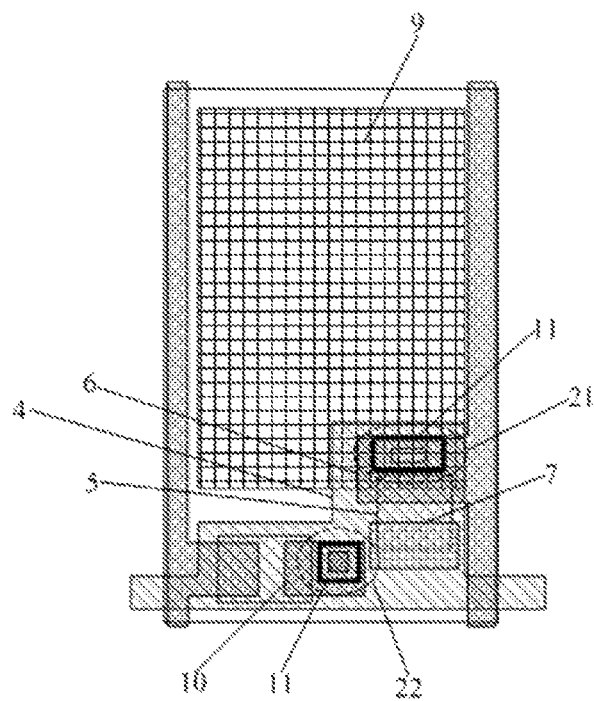
FIG. 4 is a top view of a structure of a via hole in FIG. 2 in the flexible substrate.

In the embodiment as shown in FIG. 2, FIG. 3 and FIG. 4, the on-off element includes a capacitor 1 and a via hole 2, and the insulating layer includes a gate insulating layer 4 and a passivation layer 8. A part of the gate insulating layer 4 serves as an insulating dielectric of the capacitor 1, and parts of the gate insulating layer 4 and the passivation layer 8 serve as walls of the via hole 2.

The structure of the flexible substrate in the embodiment will be described below in detail with reference to the accompanying drawings. In the embodiment, the flexible substrate includes a drive transistor formed on a flexible carrier 13. The drive transistor includes a gate 3, a gate insulating layer 4, an active layer 5, a first source 6 and a drain 7. The active layer 5 is arranged above the gate 3, the gate insulating layer 4 is arranged between the gate 3 and the active layer 5, and the first source 6 and the drain 7 are arranged above the active layer 5 and are located at both ends of the active layer 5 respectively.

Wherein, the insulating layer includes the gate insulating layer 4, one electrode plate of the capacitor 1 is made from the same material and is formed in the same patterning processes as the gate 3, while another electrode plate of the capacitor 1 is made from the same material and is formed in the same patterning processes as the first source 6, and a part of the gate insulating layer 4 located between the two electrode plates of the capacitor 1 serves as the insulating dielectric of the capacitor 1.

The gate insulating layer 4 is set in such a manner that the part of the gate insulating layer 4 serving as the insulating dielectric of the capacitor 1 and the rest part of the gate insulating layer 4 are separated from each other through a spacer region 11. Due to the formation of the spacer region 11, cracks generated in the rest part of the gate insulating layer 4 are unlikely to extend to the region where the capacitor 1 is located, namely the cracks are unlikely to extend from the rest part of the gate insulating layer 4 to the part of the gate insulating layer 4 serving as the insulating dielectric of the capacitor 1, so as to avoid the short circuit phenomenon of the capacitor 1 to ensure the normal capacitance value of the capacitor 1. This not only guarantees the reliability of the capacitor 1, but also prolongs the service life of the capacitor 1 and ensures the normal work of the flexible substrate.

It should be noted that, in the embodiment, the gate 3 and the first source 6 are connected with the two electrode plates of the capacitor 1 respectively. Of course, the gate 3 and the first source 6 may also be not connected with the two electrode plates of the capacitor 1. For example, in an OLED array substrate, a plurality of capacitors 1 are arranged in an OLED pixel drive circuit, the two electrode plates of each of some capacitors 1 are connected with the gate 3 and the first source 6 respectively, and the two electrode plates of each of the other capacitors 1 are not connected with the gate 3 and the first source 6.

In the embodiment, the flexible substrate may further include an anode 9 and the passivation layer 8, and the passivation layer 8 and the anode 9 are sequentially arranged above the drive transistor. A first via hole 21 is formed in a part of the passivation layer 8 corresponding to a region overlapped with the anode 9 and the first source 6, and a conductive material is filled in the first via hole 21, and can electrically conduct the anode 9 with the first source 6.

Wherein, the via hole 2 includes the conductive material filled in the first via hole 21, the insulating layer includes the passivation layer 8, and a part of the passivation layer 8 located between the anode 9 and the first source 6 serves as a wall of the first via hole 21.

The passivation layer 8 is set in such a manner that the part of the passivation layer 8 serving as the wall of the first via hole 21 and the rest part of the passivation layer 8 are separated from each other through the spacer region 11. Due to the formation of the spacer region 11, cracks generated in the rest part of the passivation layer 8 are unlikely to extend to the region where the via hole 2 is located, namely the cracks are unlikely to extend from the rest part of the passivation layer 8 to the part of the passivation layer 8 serving as the wall of the first via hole 21, so as to avoid the poor contact or short circuit phenomenon of the conductive material in the first via hole 21. This not only guarantees the conductive reliability of the via hole 2, but also prolongs the service life of the conductive via hole and ensures the normal work of the flexible substrate.

In addition, in the embodiment, the flexible substrate can further include a switch transistor formed on the flexible carrier 13. The switch transistor includes a second source 10 arranged on the same layer as the first source 6. A second via hole 22 is formed in a part of the gate insulating layer 4 corresponding to a region overlapped with the second source 10 and the gate 3, and a conductive material is filled in the second via hole 22, and can electrically conduct the second source 10 with the gate 3.

Wherein, the via hole 2 includes the conductive material filled in the second via hole 22, the insulating layer includes the gate insulating layer 4, and a part of the gate insulating layer 4 located between the second source 10 and the gate 3 serves as the wall of the second via hole 22.

The gate insulating layer 4 is set in such a manner that the part of the gate insulating layer 4 serving as the wall of the second via hole 22 and the rest part of the gate insulating layer 4 are separated from each other through the spacer region 11. Due to the formation of the spacer region 11, cracks generated in the rest part of the gate insulating layer 4 are unlikely to extend to the region where the via hole 2 is located, namely the cracks are unlikely to extend from the rest part of the gate insulating layer 4 to the part of the gate insulating layer 4 serving as the wall of the second via hole 22, so as to avoid the poor contact or short circuit phenomenon of the conductive material in the second via hole 22. This not only guarantees the conductive reliability of the via hole 2, but also prolongs the service life of the conductive via hole and ensures the normal work of the flexible substrate.

Figure 5:
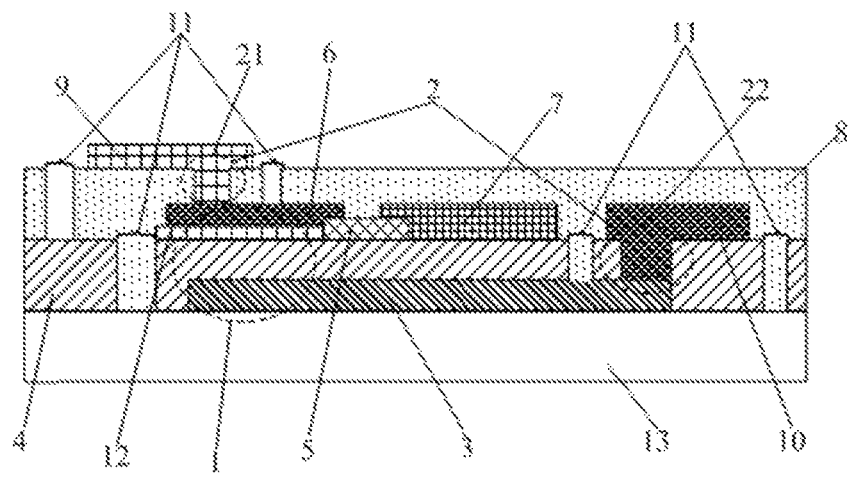
FIG. 5 is a section view of a preferred structure of an insulating layer in double-layer arrangement of the capacitor in FIG. 2.

Preferably, the part of the insulating layer is of a double-layer structure of which one layer is made from an organic insulating material and the other layer is made from an inorganic insulating material. In a preferred embodiment, as shown in FIG. 5, the part of the gate insulating layer 4 (for example, the insulating dielectric of the capacitor 1) adopts double-layer arrangement, namely an organic insulating layer 12 is overlapped above the inorganic gate insulating layer 4. Since the organic insulating layer 12 has better flexibility compared to the inorganic gate insulating layer 4, the organic insulating layer 12 can be arranged to improve the reliability of the on-off element, so as to guarantee a normal on-off effect of the on-off element.

It should be noted that, the part of the insulating layer can also be of a single-layer structure made from any one of the organic insulating material and the inorganic insulating material.

In the embodiment, both of the on-off element and the insulating layer are arranged on the flexible carrier 13. The flexible carrier 13 can be arbitrarily bent, thus the entire flexible substrate can be arbitrarily bent to achieve the flexibility of the flexible substrate.

In the flexible substrate described in the above-mentioned embodiment, the on-off element includes both of the capacitor and the via hole. However, it should be understood that, the embodiment is merely illustrated as a specific example to convey the conception and principle of the present invention to those skilled in the art, but is not intended to limit the protection scope of the present invention. The capacitor structure and the via hole structure serving as the on-off element described in the above-mentioned embodiment can be applied to various flexible substrates in an alone or combination manner according to demands, and will not be repeated herein.

Embodiment 2

The embodiment provides a flexible substrate, and differs from embodiment 1 in that the on-off element includes a transistor, and a part of an insulating layer serves as a switch insulating layer of a transistor.

Wherein, the transistor includes a drive transistor and a switch transistor which are arranged on the same layer and have the same structure. The insulating layer includes a gate insulating layer, and a part of the gate insulating layer located between the gate of the drive transistor and the active layer serves as the switch insulating layer of the drive transistor; a part of the gate insulating layer located between the gate of the switch transistor and the active layer serves as the switch insulating layer of the switch transistor.

The gate insulating layer is set in such a manner that the part of the gate insulating layer serving as the switch insulating layer of the transistor and the rest part of the gate insulating layer are separated from each other through a spacer region. Due to the formation of the spacer region, cracks generated in the rest part of the gate insulating layer are unlikely to extend to the region between the gate of the transistor and the active layer, namely the cracks are unlikely to extend from the rest part of the gate insulating layer to the part of the gate insulating layer serving as the switch insulating layer of the transistor, so as to avoid the poor contact or short circuit phenomenon of the transistor. This not only guarantees the reliability of the transistor, but also prolongs the service life of the transistor and ensures the normal work of the flexible substrate.

The other structures of the flexible substrate in the embodiment are the same as those in embodiment 1, and will not be repeated herein.

Beneficial effects of embodiment 1 and embodiment 2 are as follows: in the flexible substrate provided by embodiment 1 and embodiment 2, since the spacer region is arranged, the part of the insulating layer serving as a part of the on-off element and the rest part of the insulating layer are separated from each other, such that cracks generated in the reset part of the insulating layer are unlikely to extend to the region where the on-off element is located, namely the cracks are unlikely to extend from the rest part of the insulating layer to the part of the insulating layer serving as a part of the on-off element, and thus the poor contact or abnormal on-off phenomenon of the on-off element can be avoided, which not only guarantees the reliability of the on-off element, but also prolongs the service life of the on-off element and ensures the normal work of the flexible substrate.

Embodiment 3

The embodiment further provides a flexible display panel, including the flexible substrate in any of the above-mentioned embodiments.

By adopting the above-mentioned flexible substrate, the operation reliability of the flexible display panel is improved and the service life of the flexible display panel is prolonged at the same time.

Embodiment 4

The embodiment further provides a flexible display device, including the flexible display panel in embodiment 3.

By adopting the above-mentioned flexible display panel, the operation reliability of the flexible display device is improved and the service life of the flexible display device is prolonged at the same time.

It can be understood that, the foregoing embodiments are merely exemplary embodiments used for illustrating the principle of the present invention, but the present invention is not limited hereto. Those of ordinary skill in the art can make various variations and improvements without departing from the spirit and essence of the present invention, and these variations and improvements shall be considered to be within the protection scope of the present invention.

The invention claimed is:

1. A flexible substrate, comprising an on-off element and an insulating layer, wherein a part of the insulating layer serves as a part of the on-off element, and the part of the insulating layer serving as a part of the on-off element and rest part of the insulating layer excluding the part of the insulating layer are separated from each other through spacer regions,
   wherein the on-off element comprises at least one conductive via hole, the part of the insulating layer serves as a wall of each conductive via hole, and the spacer regions are provided at both sides of each conductive via hole with a distance between the spacer regions and the conductive via hole.

2. The flexible substrate of claim 1, further comprising a drive transistor and a switch transistor, wherein the drive transistor includes a gate, a gate insulating layer, an active layer, a first source and a drain, the active layer being arranged above the gate, the gate insulating layer being arranged between the gate and the active layer, and the first source and the drain being arranged above the active layer and located at both ends of the active layer respectively; the switch transistor includes a second source arranged on the same layer as the first source; a second via hole is formed in a part of the gate insulating layer corresponding to a region overlapped with the second source and the gate; and a conductive material is filled in the second via hole to electrically connect the second source with the gate,
   wherein the on-off element comprises the switch transistor, the insulating layer comprises the gate insulating layer, and the part of the gate insulating layer located between the second source and the gate serves as the part of the insulating layer.

3. The flexible substrate of claim 1, wherein the part of the insulating layer is of a single-layer structure made from an organic insulating material or an inorganic insulating material.

4. The flexible substrate of claim 1, wherein the part of the insulating layer is of a double-layer structure of which one layer is made from an organic insulating material and the other layer is made from an inorganic insulating material.

5. The flexible substrate of claim 1, further comprising a flexible carrier, wherein both of the on-off element and the insulating layer are arranged on the flexible carrier.

6. A flexible display panel, comprising the flexible substrate of claim 1.

7. A flexible display device, comprising the flexible display panel of claim 6.

8. The flexible substrate of claim 1, wherein the on-off element comprises a capacitor, and the part of the insulating layer serves as an insulating dielectric of the capacitor.

9. A flexible display panel, comprising the flexible substrate of claim 8.

10. The flexible substrate of claim 1, further comprising a drive transistor, which includes a gate, a gate insulating layer, an active layer, a first source and a drain, the active layer being arranged above the gate, the gate insulating layer being arranged between the gate and the active layer, and the first source and the drain being arranged above the active layer and located at both ends of the active layer respectively,
   wherein, the on-off element comprises a capacitor, one electrode plate of the capacitor is made from the same material and is formed in the same layers as the gate, while another electrode plate of the capacitor is made from the same material and is formed in the same layer as the first source, and a part of the gate insulating layer located between the two electrode plates of the capacitor serves as the part of the insulating layer.

11. A flexible display panel, comprising the flexible substrate of claim 10.

12. The flexible substrate of claim 1, further comprising a drive transistor, a passivation layer and an anode sequentially arranged above the drive transistor, wherein the drive transistor includes a gate, a gate insulating layer, an active layer, a first source and a drain, the active layer being arranged above the gate, the gate insulating layer being arranged between the gate and the active layer, and the first source and the drain being arranged above the active layer and located at both ends of the active layer respectively; a first via hole is formed in a part of the passivation layer corresponding to a region overlapped with the anode and the first source; and a conductive material is filled in the first via hole to form the conductive via hole, which is used for electrically connecting the anode with the first source, and
  wherein the on-off element comprises the conductive via hole, the insulating layer comprises the passivation layer, and the part of the passivation layer located between the anode and the first source serves as the part of the insulating layer.

13. A flexible display panel, comprising the flexible substrate of claim 12.

14. The flexible substrate of claim 1, wherein the on-off element comprises a transistor, and the part of the insulating layer serves as a switch insulating layer of the transistor.

15. The flexible substrate of claim 14, wherein the transistor comprising a drive transistor and a switch transistor which are arranged on the same layer and have the same structure, and
  wherein the insulating layer comprises a gate insulating layer, a part of the gate insulating layer located between a gate of the drive transistor and an active layer serves as the switch insulating layer of the drive transistor; and another part of the gate insulating layer located between a gate of the switch transistor and the active layer serves as the switch insulating layer of the switch transistor.

16. A flexible display panel, comprising the flexible substrate of claim 14.

* * * * *